United States Patent [19]

Ishioka et al.

[11] 4,377,628
[45] Mar. 22, 1983

[54] ELECTROPHOTOGRAPHIC MEMBER WITH α-SI AND H

[75] Inventors: Sachio Ishioka, Tokyo; Eiichi Maruyama, Kodaira; Yoshinori Imamura, Hachioji; Hirokazu Matsubara, Hamuramachi; Shinkichi Horigome, Tachikawa, all of Japan

[73] Assignee: Hitachi, Ltd., Tokyo, Japan

[21] Appl. No.: 257,346

[22] Filed: Apr. 24, 1981

[30] Foreign Application Priority Data

Apr. 25, 1980 [JP] Japan .................................. 55-54150

[51] Int. Cl.³ .......................... G03G 5/082; G03G 5/14
[52] U.S. Cl. .......................................... 430/57; 430/64; 430/67; 430/84; 430/133; 430/136; 252/501.1; 427/39; 427/74; 204/192 P; 355/3 R
[58] Field of Search ............... 430/57, 84, 133, 136; 252/501.1; 75/345; 427/39, 74; 204/192 P; 355/3 R

[56] References Cited

U.S. PATENT DOCUMENTS

| | | | |
|---|---|---|---|
| 4,217,374 | 8/1980 | Ovshinsky et al. | 430/57 X |
| 4,225,222 | 9/1980 | Kempta | 430/57 X |
| 4,265,991 | 5/1981 | Hirai et al. | 430/84 X |
| 4,289,822 | 9/1981 | Shimada et al. | 427/74 X |

Primary Examiner—Roland E. Martin, Jr.
Attorney, Agent, or Firm—Antonelli, Terry & Wands

[57] ABSTRACT

Disclosed is an electrophotographic member having an amorphous-silicon photoconductive layer, wherein the distance between a portion in which light illuminating the photoconductor is absorbed therein until its intensity decreases to 1% of that at incidence and the interface of the photoconductor opposite to the light incidence side thereof is at most 5 μm, whereby the residual potential of the photoconductive layer can be reduced.

That part of the photoconductive layer constituting the electrophotographic member which is at least 10 nm thick inwardly of the photoconductive layer from the surface thereof to store charges is made of amorphous silicon which has an optical forbidden band gap of at least 1.6 eV and a resistivity of at least $10^{10}$ Ω·cm. Further, within such photoconductive layer, a region of amorphous silicon which has an optical forbidden band gap smaller than that of the amorphous silicon forming the surface part is disposed at a thickness of at least 10 nm. By forming the region of the narrower optical forbidden band gap within the photoconductive layer in this manner, the sensitivity of the photoconductive layer to light of longer wavelengths can be enhanced.

24 Claims, 10 Drawing Figures

ELECTROPHOTOGRAPHIC MEMBER WITH α-SI AND H

BACKGROUND OF THE INVENTION

1. Field of the Invention

This invention relates to an electrophotographic member for use as an electrophotographic plate. More particularly, it relates to improvements in an electrophotographic member which employs amorphous silicon for a photoconductive layer.

2. Description of the Prior Art

As photoconductive materials to be used for electrophotographic members, there have heretofore been inorganic substances such as Se, CdS and ZnO and organic substances such as polyvinyl carbazole (PVK) and trinitrofluorenone (TNF). Although they exhibit high photoconductivities, they have the disadvantage that the layers of the substances exhibit insufficient hardnesses, so they have their surfaces flawed or wear away during the operations as the electrophotographic members. In addition, many of these materials are substances harmful to the human body. It is therefore unfavorable that the layers wear away to adhere on copying paper even if in small amounts. In order to improve these disadvantages, it has been proposed to employ amorphous silicon for the photoconductive layer (refer to, for example, the official gazette of Japanese Laid-open Patent Application No. 54-78135). In general, however, the amorphous silicon layer exhibits a dark resistivity which is too low for the electrophotographic member. The amorphous silicon layer having a high resistivity on the order of $10^{10}$ Ω·cm exhibits a photoelectric gain being too low, and only an unsatisfactory one has been obtained as the electrophotographic member.

SUMMARY OF THE INVENTION

This invention has for its object to provide an electrophotographic member which is free from the fear of degradation in the resolution and which exhibits a low residual potential.

Useful for accomplishing the object is a method in which the internal structure of an amorphous photoconductive layer is defined so that the region thereof in an electrophotographic member where illuminating light is sufficiently absorbed may be brought near to a substrate electrode in a manner to be spaced therefrom at most 5 μm. The same object can also be accomplished by confining the wavelength of illuminating light to be used for erasing charges, though this measure results in a similar construction to the above.

More specifically, in an electrophotographic member having an amorphous-silicon photoconductive layer, the distance between the portion of the photoconductive layer in which light illuminating the photoconductive layer is absorbed therein until its intensity decreases down to 1% of that at incidence and the interface of the photoconductive layer opposite to the light incidence side is made at most 5 μm.

Further, in the photoconductive layer of amorphous silicon constituting the electrophotographic member, a part at least 10 nm thick inwardly of the photoconductive layer from the surface thereof on the side on which charges are stored has its optical forbidden band gap made at least 1.6 eV and its resistivity made at least $10^{10}$ Ω·cm. Further, within the photoconductive layer, a region of amorphous silicon whose optical forbidden band gap is smaller than that of amorphous silicon forming the surface region is provided to a thickness of at least 10 nm. By forming the region of the narrower optical forbidden band gap within the photoconductive layer in this manner, the sensitivity of the photoconductive layer to light of longer wavelengths can be enhanced.

Regarding the improvements of extending the sensitivity of the electrophotographic member to the longer wavelength region, patent applications are pending in U.S.A., etc.

DETAILED DESCRIPTION OF THE INVENTION

Figure 1:
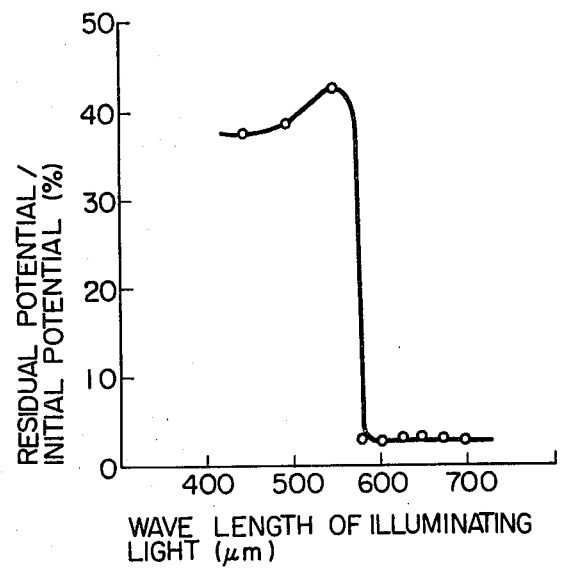
FIG. 1 is a graph showing the relationship between the residual potential characteristics of an amorphous-silicon photoconductive layer and the wavelength of illuminating light.

The inventors produced an electrophotographic member by the use of an amorphous silicon layer having a resistivity of at least $10^{10}$ Ω·cm over the entire layer, and investigated the residual potential characteristics thereof in detail. The result is shown in FIG. 1. It has been revealed from the result that the magnitude of the residual potential depends greatly upon the wavelength of illuminating light. That is, the residual potential is conspicuously great on the side on which the wavelength of the incident light is shorter than a certain value, and it is extremely small on the side on which the wavelength is longer. This tendency becomes especially remarkable in case where the thickness of the sample exceeds 5 μm.

As to this phenomenon, the inventors conjecture as follows. Amorphous silicon containing hydrogen differs in the quantity of hydrogen contained therein and the form of the coupling between hydrogen and silicon, depending upon the producing conditions of the layer, and has a peculiar optical forbidden band gap accordingly. Therefore, light of energy lower than energy corresponding to the optical forbidden band gap is transmitted through the layer without generating carriers based on the photo excitation. Regarding the amorphous silicon layer used in the measurement of FIG. 1, results obtained by measuring the absorption of light of each wavelength within the layer are shown in FIG. 2.

Figure 2:
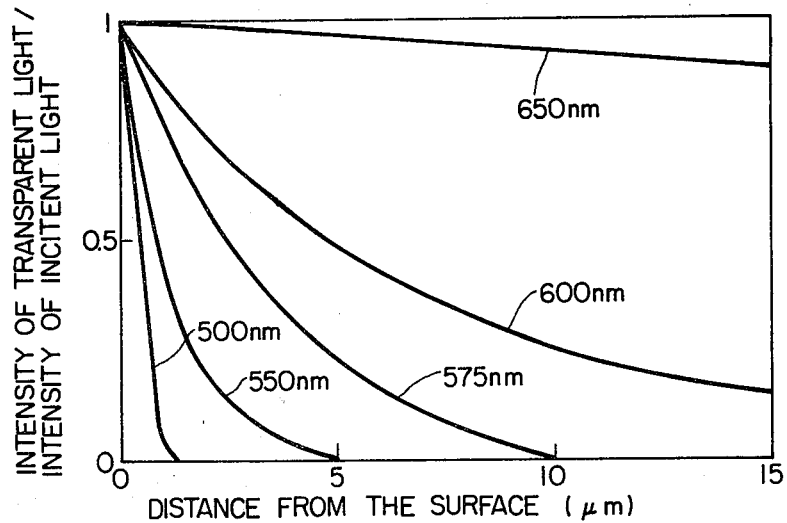
FIG. 2 is a graph for explaining the circumstances in which the incident light is absorbed within the amorphous-silicon photoconductive layer.

It is understood from FIG. 2 that, as the wavelength of the illuminating light is shorter, the light is absorbed in the closer vicinity of the surface. Among the carriers generated by the absorbed light, those of the opposite sign to that of charges stored on the surface side of the photoconductive layer flow towards the surface to neutralize the charges, whereas those of the same sign must migrate to an electrode underlying the layer. Since the amorphous silicon layer in which the carriers migrate contains hydrogen, localized states within the layer have been considerably extinguished, but carrier trap levels are still existent in the amorphous silicon more than in crystalline silicon, so that the property of the layer allowing the migration is inferior. When, in consequence, the generated photo-carriers remain without being sufficiently drawn out, they will form a cause for increasing the residual potential.

Referring here to FIG. 1, the residual potential is extremely low in cases where the wavelength of the illuminating light is longer than the certain value. In view of FIG. 2, the wavelength of the boundary between the high and low residual potentials has been revealed to correspond to energy at which the illuminating light passes through the whole photoconductive layer to reach the underlying substrate.

Figure 3:
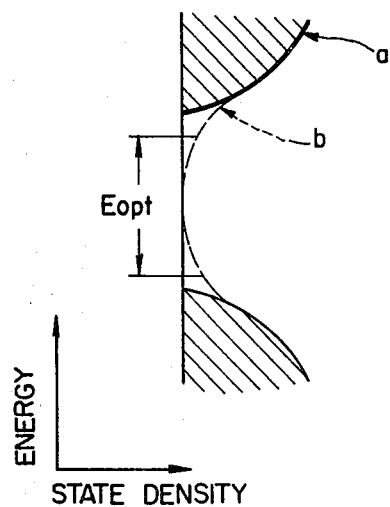
FIG. 3 is a diagram showing the state densities of crystalline silicon and amorphous silicon.

In the energy band structure, as shown by a curve (b) in FIG. 3, the amorphous silicon containing hydrogen has a state density spreading inside the optical forbidden band gap ($E_{opt}$) in contrast to the crystalline silicon (illustrated by a curve (a) in FIG. 3). Such foot of the state density forms one cause for the trap level stated above. However, when this part is illuminated by the longer wavelength light, i.e., light of energy somewhat lower than the optical forbidden band gap, it is cleared by the illuminating light, and the property permitting the carriers to migrate increases.

It is construed that the foregoing is the ground on which the wavelength-dependency as shown in FIG. 1 appears, and that among the photo-carriers, those flowing onto the surface side can reach the surface owing to the good migration property, whereas those flowing onto the underlying substrate side migrate through the part of the inferior migration property not illuminated by the light, so they form the residual potential component without reaching the substrate. Therefore, when the layer becomes thick beyond a certain degree and the migration region on the underlying substrate side becomes long, the residual potential increases.

As the allowable limit of the residual potential, since the present-day toner adheres to a photoconductive layer at approximately 600 V and separates away therefrom at or below 200 V, it is considered that a value of at most approximately 40% is desirable and that a value of at most 20% is more desirable. In order to attain this value, it has been necessary to make the distance from a region, in which at least 99% of the illuminating light is absorbed, to the underlying substrate at most 5 μm, more desirably at most 2 μm.

An actual electrophotographic member sometimes needs to have a thickness of 10–20 μm or above in order to withstand a voltage enough to hold the toner, and the light absorbing part must be made considerably close to the substrate side at that time.

One expedient therefor is to limit the wavelength of the illuminating light. The wavelength corresponding to the optical forbidden band gap $E_{opt}$ is:

$$\lambda_1 \text{ (nm)} = \frac{1,240}{E_{opt} \text{ (eV)}} \tag{1}$$

Letting $\lambda_2$ denote the wavelength of the light which, as stated previously, is absorbed 99% before it reaches the distance of 5 μm from the underlying substrate side in the amorphous silicon layer used, the incident light may be confined within the following range:

$$\lambda_2 \leq \text{(wavelength of incident light)} \leq \lambda_1 \tag{2}$$

Then, the electrophotographic member can have its residual potential suppressed sufficiently low while holding its photoconductivity high.

Table 1 lists examples of the relationship between the hydrogen content and optical forbidden band gap ($E_{opt}$) of amorphous silicon. Regarding hydrogen contents other than those of the concrete examples, interpolations may be satisfactorily made.

TABLE 1

| Hydrogen content (at.-%) | $E_{opt}$ (eV) | $\lambda_1$ (nm) |
|---|---|---|
| 5 | 1.3 | 950 |
| 10 | 1.45 | 850 |
| 15 | 1.6 | 775 |
| 20 | 1.8 | 690 |
| 25 | 2.0 | 620 |

In case of using the photoconductive layer of this invention in a laser beam printer etc., the laser wavelength may be selected so as to fulfill the condition of Expression (2). According to the result of the inventors' study, the wavelength $\lambda_2$ depends upon the thickness of the photoconductive layer. It is approximately 100–150 nm shorter than the wavelength $\lambda_1$. It is experimentally determined.

In a system wherein the photoconductive layer of this invention is illuminated by an ordinary white lamp or the like, it is satisfactory in practical use to utilize the illuminating light by passing it through a filter which cuts the side of wavelengths shorter than $\lambda_2$ to the amount of at least 80%. For the betterment of the residual potential, it is important that the illuminating light principally includes the component of wavelengths longer than $\lambda_2$. In case where the spectral width of the illuminating light is great, a satisfactory sensitivity is attained by the component fulfilling Expression (2). It is particularly important that, among the principal spectral components of the illuminating light, one on the longer wavelength side meets the aforecited condition.

In addition, there is an expedient in which the sensitivity to light of longer wavelengths is enhanced by forming a region of narrowed optical forbidden band gap within the photoconductive layer. This expedient will be described.

In a light receiving device of the storage mode such as the electrophotographic member, the resistivity of the photoconductive layer must satisfy the following two required values:

(1) The resistivity of the photoconductive layer needs to be above approximately $10^{10}$ Ω·cm lest charges stuck on the surface of the layer by the corona discharge or the like should be discharged in the thickness direction of the layer before exposure.

(2) Also the sheet resistance of the photoconductive layer must be sufficiently high lest a charge pattern formed on the surface (as well as the interface) of the photoconductive layer upon the exposure should disappear before developing on account of the lateral flow of the charges. In terms of the resistivity, this becomes above approximately $10^{10}$ Ω·cm as in the preceding item.

Amorphous silicon having such resistivity is, in general, a material whose optical forbidden band gap is at least 1.6 eV.

In order to meet the conditions of the two items, the resistivity of and near the surface of the photoconductive layer to hold the charges must be above approximately $10^{10}$ Ω·cm, but the resistivity of at least $10^{10}$ Ω·cm need not be possessed uniformly in the thickness direction of the layer. Letting $\tau$ denote the time constant of the dark decay in the thickness direction of the layer, C denote the capacitance per unit area of the layer and R denote the resistance in the thickness direction per unit area of the layer, the following relation holds:

$$\tau = RC \qquad (3)$$

The time constant $\tau$ may be sufficiently long as compared with the period of time from the electrification to the developing, and the resistance R may be sufficiently great with the thickness direction of the layer viewed macroscopically.

The inventors have revealed that, as a factor which determines the macroscopic resistance in the thickness direction of the layer in a high-resistivity thin-film device such as the electrophotographic member, charges to be injected from the interface with an electrode play an important role besides the resistivity of the layer itself.

The inventors have considered to solve this problem by employing high-resistivity amorphous silicon which has a resistivity of at least $10^{10}$ Ω·cm as its layer. Ordinarily, such high-resistivity region is the intrinsic semiconductor (i-type). This region functions as a layer which blocks the injection of carriers from the electrode into the photoconductive layer, and can simultaneously be effectively used as a layer which holds the surface charges. In this case, the resistivity of that part of the photoconductive layer which does not adjoin the surface (or interface) need not always be as high as in the vicinity of the surface (or interface). That is, the macroscopic resistance R of the photoconductive layer may satisfy Expression (3). Therefore, the sensitivity can be extended to the light of the longer wavelength region owing to a structure in which the optical forbidden band gap of the interior of the photoconductive layer is narrowed, so that the amorphous silicon layer can also be used as a photoconductive layer for a semiconductor laser beam printer.

In order to more effectively block the injection of the carriers from the electrode, it is also effective to interpose a thin layer of $SiO_2$, $CeO_2$, $Sb_2Sb_3$, $Sb_2Se_3$, $As_2S_3$, $As_2Se_3$ or the like between the electrode and the amorphous silicon layer.

Figure 4:
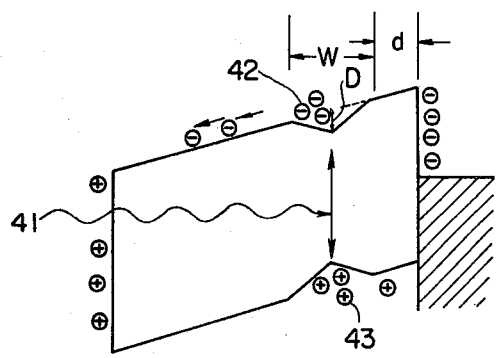
FIG. 4 is a diagram for explaining the circumstances in which incident light is absorbed within an amorphous-silicon photoconductive layer of a structure having a region of a narrower optical forbidden gap within the layer.

When the region of narrow forbidden band gap has been formed within the photoconductive layer in this manner, the longer wavelength light is absorbed in this region to generate electron-hole pairs. The situation is illustrated as an energy band model in FIG. 4. Since, in both the region of wide forbidden band gap and the region of narrow forbidden band gap, the resistances of the portions themselves are desired to be as high as possible, the photoconductive layer should more preferably be fully intrinsic (i-type). At this time, the energy band model becomes a shape constricted vertically with respect to the Fermi level. Photo-carriers generated in the constriction or the region of narrowed forbidden band gap are captured in the region by a built-in field existing therein. In order to draw the photo-carriers out of the region of narrowed forbidden band gap with an external electric field and to utilize them as effective photo-carriers, the external electric field must be greater than the built-in field of the region of narrowed forbidden band gap. Conversely stated, in case of forming the region of narrowed forbidden band gap, the built-in field to arise therein must become smaller than the external electric field. The built-in field of the region of narrowed forbidden band gap depends upon the depth (potential difference) D and the width W of the region. An abrupt change of the band gap generates a great built-in field, whereas a gentle change of the band gap generates a small built-in field. When the shape of the region of narrowed forbidden band gap is approximated by an isosceles triangle, the condition for drawing out the photo-carriers is:

$$E_a \geq 2D/W \qquad (4)$$

where $E_a$ denotes the external electric field.

Within the amorphous-silicon photoconductive layer, the part in which the region of narrowed forbidden band gap exists should preferably be disposed in the portion of at most 5 μm from the interface (for example, the underlying substrate side) opposite to the light incidence side as stated before. In order to generate effective photo-carriers in the region of narrowed forbidden band gap, the width W of this region needs to be, in effect, at least 10 nm. The maximum limit of the width of the region of narrowed forbidden band gap is, of course, the whole thickness of the amorphous silicon layer, but the width W of the region is desired to be at most ½ of the whole thickness of the layer in order to keep the total resistance R in the thickness direction sufficiently high.

The whole thickness of the amorphous-silicon photoconductive layer is determined by the surface potential, which in turn varies depending upon the kind of toner used and the service conditions of the photoconductive layer. However, the withstand voltage of the amorphous silicon layer is considered to be 10 V–50 V per μm. Accordingly, when the surface potential is 500 V, the entire layer thickness becomes 10 μm–50 μm. Values of the entire layer thickness exceeding 100 μm are not practical.

In case of applying the method of this invention to the photoconductive layer of such structure, with note taken of the fact that the absorption of light occurs principally in the region of narrowed optical forbidden band gap, the place in which this region exists should preferably be disposed in the vicinity of the underlying substrate side spaced therefrom only the distance d of at most 5 μm. This situation is elucidated in FIG. 4. The figure illustrates a case where positive charges are stored on the surface, and electrons 42 and holes 43 generated by incident light 41 flow so as to neutralize the charges.

Hereunder will be described the concrete structure of an electrophotographic member having an amorphous-silicon photoconductive layer.

Figure 5:
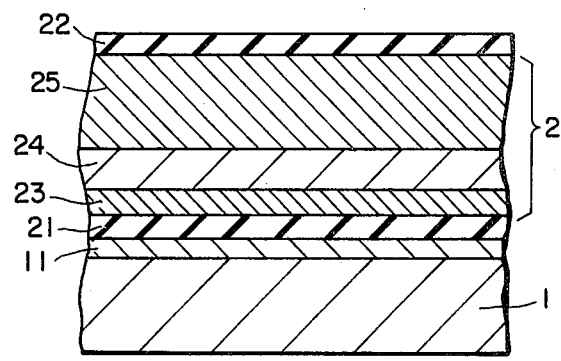
FIGS. 5, 8 and 9 are sectional views each showing essential portions of an electrophotographic member which has an amorphous-silicon photoconductive layer.

Referring to FIG. 5, numeral 1 designates a substrate, and numeral 2 a photoconductive layer including an amorphous silicon layer. The substrate 1 may be any of a metal plate such as aluminum, stainless steel or nichrome plate, an organic material such as polyimide resin, glass ceramics etc. In case where the substrate is an electrical insulator, an electrode 11 needs to be deposited on the substrate. Used as the electrode is a thin film of a metal material such as aluminum and chromium, or a transparent electrode of an oxide such as $SnO_2$ and In—Sn—O. The photoconductive layer 2 is disposed on the electrode. In case where the substrate 1 is light-transmissive and the electrode 11 is transparent, light to enter the photoconductive layer 2 is sometimes projected through the substrate 1. The photoconductive layer 2 can be provided with a layer 21 for suppressing the injection of excess carriers from the substrate side, and a layer 22 for suppressing the injection of charges from the surface side. As the layers 21 and 22, layers of a high-resistivity oxide, sulfide or selenide such as SiO, $SiO_2$, $Al_2O_3$, $CeO_2$, $V_2O_3$, $Ta_2O$, $As_2Se_3$ and $As_2S_3$ are used, or layers of an organic substance such as polyvinyl carbazole are sometimes used. Although these layers 21 and 22 serve to improve the electrophotographic characteristics of the photoconductive layer of this invention, they are not always absolutely indispensable. All layers 23, 24 and 25 are layers whose principal constituents are amorphous silicon. Each of the layers 23 and 25 is an amorphous silicon layer which satisfies the characteristics of this invention described before and which has a thickness of at least 10 nm. Even when the resistivity of the layer 23 is below $10^{10}$ $\Omega$·cm, no bad influence is exerted on the dark decay characteristics as the electrophotographic member owing to the presence of the layers 21 and 22. Although, in FIG. 5, the amorphous silicon layer has the three-layered structure, it may of course be a uniform amorphous-silicon layer generally meeting the requirement of this invention as well. It is sometimes the case that the amorphous silicon layer is doped with carbon or a very small amount of boron or germanium in order to vary the electrical and optical characteristics of the layer. However, it is necessary for ensuring photoconductive characteristics that at least 50 atomic-% of silicon is contained on the average within the layer. As long as this requirement is fulfilled, produced layers fall within the scope of this invention whatever other elements they may contain.

As methods for forming the amorphous silicon layer containing hydrogen, the process exploiting the decomposition of $SiH_4$ by the glow discharge, the reactive sputtering process, the ion-plating process etc. have been known. With any of the methods, a layer having the best photoelectric conversion characteristics is obtained when the substrate temperature during the formation of the layer is 150°–250° C. In case of the glow discharge process, a layer of good photoelectric conversion characteristics has as low a resistivity as $10^6$–$10^7$ $\Omega$·cm and is unsuitable for electrophotography. Therefore, such a consideration as doping the layer with a slight amount of boron to raise its resistivity is necessary. In contrast, the reactive sputtering process can produce a layer having a resistivity of at least $10^{10}$ $\Omega$·cm besides good photoelectric conversion characteristics, and moreover, it can form a uniform layer of large area by employing a sputtering target of sufficiently large area. It can therefore be said particularly useful for forming the photoconductive layer for electrophotography.

Figure 6:
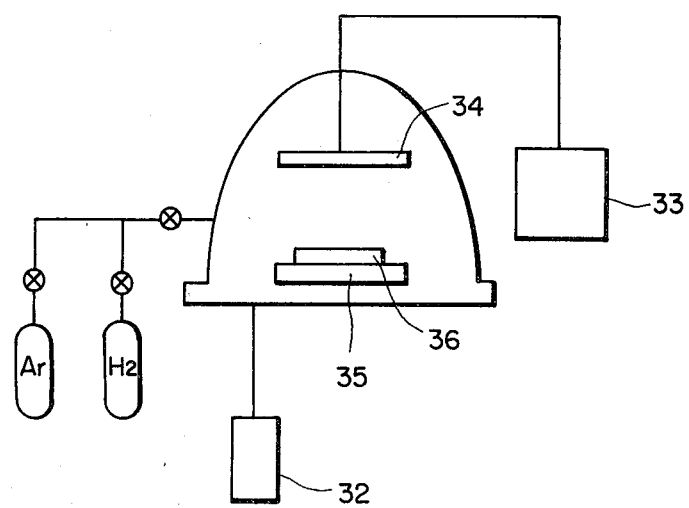
FIG. 6 is a view for explaining a reactive sputtering equipment which is used for producing amorphous silicon.

Usually, the reactive sputtering is performed by the use of an equipment as shown in FIG. 6. Referring to the figure, numeral 31 designates a bell jar, numeral 32 an evacuating system, numeral 33 a radio-frequency power source, numeral 34 a sputtering target, numeral 35 a substrate holder, and numeral 36 a substrate. Sputtering equipment include, not only the structure which serves to perform the sputter-evaporation on the flat substrate as exemplified in the figure, but also a structure which can perform the sputter-evaporation on a cylindrical or drum-shaped substrate. Therefore, they may be properly employed according to intended uses.

The reactive sputtering is carried out by evacuating the bell jar 31, introducing hydrogen and such an inert gas as argon thereinto, and supplying a radio-frequency voltage from the radio-frequency power source 33 to cause a discharge. The quantity of hydrogen which is contained in a layer to be formed at this time is determined principally by the pressure of hydrogen existent in the atmosphere gas during the discharge. The amorphous silicon layer containing hydrogen as is suited to this invention is produced when the hydrogen pressure during the sputtering lies in a range of from $5 \times 10^{-5}$ Torr to $9 \times 10^{-3}$ Torr.

The localized state density in the pure amorphous silicon containing no hydrogen is presumed to be on the order of $10^{20}$/cm$^3$. Supposing that hydrogen atoms extinguish the localized states at 1:1 in case of doping such amorphous silicon with hydrogen, all the localized states ought to be extinguished with a hydrogen-doping quantity of approximately 0.1 atomic-%. However, it is for the first time when the hydrogen content exceeds approximately 1 atomic-% that amorphous silicon useful as a photoconductor is actually obtained owing to the appearance of the photoconductivity and to the occurrence of the variation of the optical forbidden band gap. Hydrogen can be contained up to approximately 50 atomic-%, but a content of at most 40 atomic-% is common and especially a content of at most 30 atomic-% is practical.

A material in which part of silicon is substituted by germanium, carbon or the like can also be used for the electrophotographic member. Useful as the quantity of the substitution by germanium or carbon is within 30 atomic-%.

In order to vary the hydrogen content of the amorphous silicon layer, there may be controlled the substrate temperature, the concentration of hydrogen in an atmosphere, the input power, etc. in the case of forming the layer by the use of any of the layer forming methods already stated.

Among the layer forming methods mentioned above, one which is excellent in the process controllability and which can readily produce a photoconductive amorphous silicon layer of high resistivity and good quality is the reactive sputtering process.

By doping the amorphous silicon layer with an impurity, it can be turned into a conductivity type such as p-type and n-type.

Figure 7:
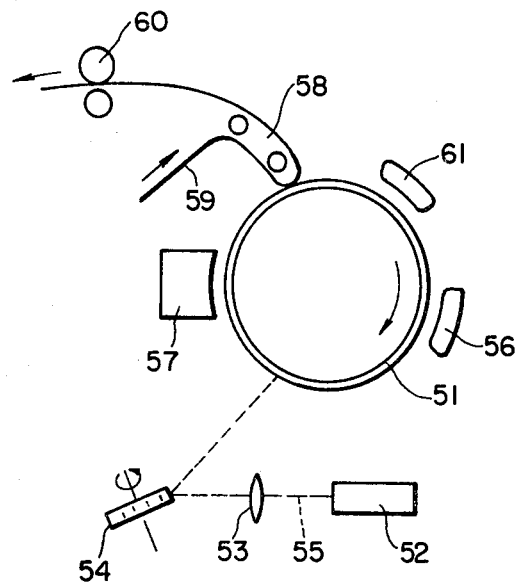
FIG. 7 is a view showing the construction of a laser beam printer.

Referring to FIG. 7, the electrophotographic plate according to the present invention is formed on the surface of a rotary drum 51. When the rotary drum 51 is formed of a conductor such as aluminum, the rotary drum 51 per se may be used as the conductor substrate of the electrophotographic member according to the present invention. When a rotary drum formed of glass or the like is used, a conductor such as a metal is coated on the surface of the rotary drum of glass, and a plurality of predetermined amorphous Si layers are laminated thereon. Beams 55 from a light source 52 such as a semiconductor laser pass through a beam collecting lens 53 and impinge on a polyhedral mirror 54, and they are reflected from the mirror 54 and reach the surface of the drum 51.

Charges induced on the drum 51 by a charger 56 are neutralized by signals imparting to the laser beams to form a latent image. The latent image region arrives at a toner station 57 where a toner adheres only to the latent image area irradiated with the laser beams. This toner is transferred onto a recording paper 59 in a transfer station 58. The transferred image is thermally fixed by a fixing heater 60. Reference numeral 61 represents a cleaner for the drum 51.

There may be adopted an embodiment in which a glass cylinder is used as the drum, a transparent conductive layer is formed on the glass cylinder and predetermined Se layers are laminated thereon.

In this embodiment, the writing light source may be disposed in the cylindrical drum. In this case, beams are incident from the conductor side of the electrophotographic plate.

Needless to say, applications of the electrophotographic member are not limited to the above-mentioned embodiments.

In the instant specification and appended claims, by the term "electrophotographic member" is meant one that is used for an electrophotographic device, a laser beam printer equipment and the like in the fields of electrophotography, printing, recording and the like.

Hereunder, this invention will be concretely described in conjunction with examples.

EXAMPLE 1

Figure 8:
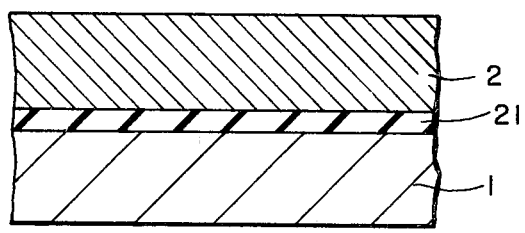

FIG. 8 is a sectional view of an electrophotographic member of this example.

An aluminum cylinder whose surface was mirror-polished was heated at 300° C. in an oxygen atmosphere for 2 hours, to form an $Al_2O_3$ film 21 on the surface of the cylinder 1. The cylinder was installed in a rotary magnetron type sputtering equipment, the interior of which was evacuated up to $1\times10^{-6}$ Torr. Thereafter, whilst holding the cylinder at 200° C., an amorphous silicon film 2 having an optical forbidden band gap of 1.95 eV and a resistivity of $10^{11}$ Ω·cm was deposited thereon to a thickness of 20 μm at a deposition rate of 2 Å/sec by a radio-frequency output of 350 W in a mixed atmosphere consisting of $2\times10^{-3}$ Torr of hydrogen and $3\times10^{-3}$ Torr of argon. The cylinder thus prepared was used to fabricate an electrophotographic device of a system in which the amorphous silicon film was illuminated by a He—Ne laser beam (wavelength: 630 nm) or by a white lamp through a filter adapted to cut light of and below 500 nm to the amount of at least 90%.

Owing to such construction, especially the residual potential can be sharply lowered.

More specifically, in an electrophotographic member having an amorphous-silicon photoconductive layer which contains at least 50 atomic-% of silicon and at least 1 atomic-% of hydrogen on the average within the layer, the distance between a portion in which light illuminating the photoconductive layer (light contributive to create photo-carriers within the photoconductor) is absorbed within the photoconductor until its intensity becomes 1% of that at incidence and the interface of the photoconductive layer opposite to the light incidence side thereof is at most 5 μm.

Table 2 lists examples in which amorphous silicon containing 12 atomic-% of hydrogen to form an electrophotographic member was set at various thicknesses, and the residual potentials of the samples were measured. Illuminating light was 575 nm.

TABLE 2

| No. | Remaining light intensity (%) | Distance to opposite interface (μm) | Residual potential/Initial potential (%) | Thickness of layer (μm) | |
|---|---|---|---|---|---|
| 1 | 1 | 3 | 5 | 13 | |
| 2 | 1 | 5 | 5 | 15 | |
| 3 | 1 | 10 | 38 | 20 | comp. ex. |
| 4 | 1 | 15 | 40 | 25 | comp. ex. |

Table 3 indicates the relations between the residual potential and the value of the remaining light intensity at a position of 5 μm from the interface of a photoconductive layer opposite to the light incidence side thereof as represented by the percentage with respect to incident light ((remaining light intensity/incident light intensity)×100). As in the foregoing examples, the photoconductive layers were of amorphous silicon containing 12 atomic-% of hydrogen.

TABLE 3

| No. | Remaining light intensity (%) | Distance to opposite interface (μm) | Residual potential/Initial potential (%) | Thickness of layer (μm) | |
|---|---|---|---|---|---|
| 1 | 0.5 | 5 | 3 | 13 | |
| 2 | 1 | 5 | 5 | 15 | |
| 3 | 5 | 5 | 30 | 16 | comp. ex. |
| 4 | 10 | 5 | 40 | 18 | comp. ex. |

From the results of Tables 2 and 3, it is understood that the residual potential can be sharply lowered by making the intensity of the incident light on the photoconductive layer at most 1% of the intensity at the incidence in the portion 5 μm distant from the interface of the photoconductive layer opposite to the light incidence side thereof.

EXAMPLE 2

Figure 9:
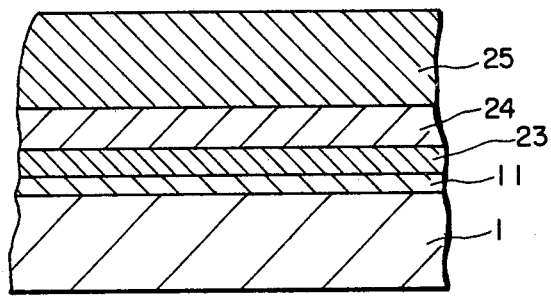

This example will be described with reference to FIG. 9.

On a hard glass cylinder 1, a transparent electrode of $SnO_2$ 11 was formed by the thermodecomposition of $SnCl_4$ at 450° C. The resultant cylinder was installed in a rotary sputtering equipment, the interior of which was evacuated up to $2\times10^{-6}$ Torr. Subsequently, whilst holding the cylinder at 250° C., an amorphous silicon film (hydrogen content: 17.5 atomic-%) 23 having an optical forbidden band gap of 1.95 eV and a resistivity of $10^{11}$ Ω·cm was deposited to a thickness of 18 μm at a deposition rate of 1 Å/sec by a radio-frequency power of 300 W (at a frequency of 13.56 MHz) in a mixed atmosphere consisting of $2\times10^{-3}$ Torr of hydrogen and $2\times10^{-3}$ Torr of argon. Thereafter, whilst holding the pressure of argon constant, the pressure of hydrogen was gradually lowered down to $3\times10^{-5}$ Torr over a period of time of 20 minutes. The amorphous silicon at the minimum hydrogen pressure (hydrogen content: 9 atomic-%) had an optical forbidden band gap of 1.6 eV and a resistivity of $10^8$ Ω·cm. Further, the hydrogen pressure was gradually raised up to $2\times10^{-3}$ Torr again over 20 minutes. Under this state, the sputtering was continued to form amorphous silicon layers 24 and 25 into the whole thickness of 20 μm. A blocking layer of $As_2Se_3$ or the like may well be inserted on the transparent electrode 11. A blocking layer as stated before may well be disposed on the photoconductive layer 25. The thickness of the region whose optical forbidden band gap was less than 1.95 eV was approximately 2,500 Å, and the distance thereof from the underlying substrate was 1.7 μm. The cylinder was used as an electrophotographic drum.

Also in case of such construction in which the region of narrow forbidden band gap is included in the photoconductive layer, this invention is effective for reducing the residual potential.

The electrophotographic member above described had its sensitivity and residual potential characteristics measured with a semiconductor laser having an emission wavelength of 760 nm. The results are indicated in Table 4.

TABLE 4

| Sample | Sensitivity (1/erg) | Residual potential/ Initial potential (%) |
| --- | --- | --- |
| This example. | 0.07 | 5 |
| The region of narrow band gap is located in the middle of the layer. | 0.07 | 15 |
| The region of narrow band gap is not formed. | <0.001 | >80 |

Figure 10:
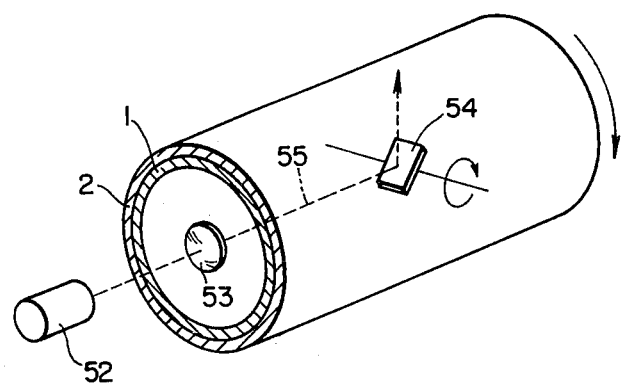
FIG. 10 is a view showing the construction of an electrophotographic drum.

As shown in FIG. 10, the laser beam was projected onto the photoconductive layer from inside the drum. In the figure, numeral 1 designates a glass substrate, and numeral 2 a photoconductive layer. The details of the construction of the electrophotographic member, such as the electrode etc., are omitted from the illustration. Numeral 52 indicates a semiconductor laser, numeral 53 a beam collecting lens, numeral 54 a mirror, and numeral 55 a laser beam. From the results of Table 4, it is understood that the present invention is extraordinarily excellent in the sensitivity and especially in the residual potential characteristics.

EXAMPLE 3

This example is a case where amorphous silicon doped with carbon is used at the surface and interface of a conductive layer. The fundamental structure is as shown in FIG. 9.

On a polyimide film 1 a chrome film 11 was vacuum-evaported to a thickness of 400 Å, to prepare a substrate. The resultant layer was installed in a sputtering equipment, the interior of which was evacauted up to $5\times10^{-7}$ Torr. Thereafter, whilst holding the substrate at 150° C. and by employing a target of polycrystalline silicon containing 10% of carbon, a film of amorphous silicon—carbon 22 having an optical forbidden band gap of 2.0 eV and a resistivity of $10^{13}$ Ω·cm was formed 3 μm at a deposition rate of 3 Å/sec under a radio-frequency power of 350 W in a gaseous mixture consisting of $1\times10^{-3}$ Torr of hydrogen and $4\times10^{-3}$ Torr of argon. The hydrogen content of this film was approximately 14 atomic-%. Thereafter, sputtering was performed by the use of a target made up of silicon only and in a gaseous mixture consisting of $2\times10^{-3}$ Torr of argon and $2\times10^{-3}$ Torr of hydrogen, to form a film of amorphous silicon 23 having a thickness of 60 nm and exhibiting an optical forbidden band gap of 1.85 eV as well as a resistivity of $10^{11}$ Ω·cm. Further, on the film 23, a film 24 of the first amorphous silicon—carbon was formed 5 μm.

An electrophotographic member having a satisfactory resolution and good residual potential characteristics with respect to incident light at 650 nm could be realized.

EXAMPLE 4

Reference is had to FIG. 5.

On a hard glass cylinder 1, an $SnO_2$ transparent electrode 11 was formd by the thermodecomposition of $SnCl_4$ at 450° C. The resultant cylinder was installed in a rotary sputtering equipment, the interior of which was evacuated up to approximately $2\times10^{-6}$ Torr. Subsequently, whilst holding the cylinder at 250° C., an amorphous silicon film (hydrogen content: 17.5 atomic-%) 22 was deposited 20 Å by a radio-frequency power of 13.56 MHz and 300 W in a mixed atmosphere consisting of $2\times10^{-3}$ Torr of hydrogen and $2\times10^{-3}$ Torr of argon. The optical forbidden band gap of this film was 1.95 eV, and the resistivity was $10^{11}$ Ω·cm. Thereafter, using a sputtering target in which silicon and germanium were juxtaposed, a germanium-containing amorphous silicon film 23 was deposited to a thickness of 0.1 μm. The sputtering was a gaseous mixture consisting of $1\times10^{-3}$ Torr of hydrogen and $2\times10^{-3}$ Torr of argon. The content of germanium was 30 atomic-%, and that of hydrogen was 10 atomic-%. In addition, the optical forbidden band gap was approximately 1.40 eV, and the resistivity was approximately $10^9$ Ω·cm. Subsequently, an amorphous silicon film 24 was formed 3 μm under the same conditions as those of the first amorphous silicon film. The optical forbidden band gap of the film 24 was 1.95 eV, and the resistivity was $10^{11}$ Ω·cm. When the germanium-containing amorphous silicon was used in this manner, an electrophotographic member having a satisfactory resolution and good residual potential characteristics with respect to illuminating light of 580 nm projected from inside the cylinder could be realized.

What is claimed is:

1. In an electrophotographic member having at least a support and a photoconductive layer of amorphous silicon containing hydrogen carried by said support, said support being made of a conductive material or an insulating material having a layer of a conductive material thereon, the improvement comprising that said photoconductive layer of an amorphous silicon containing hydrogen has at least 50 atomic % amorphous silicon and said hydrogen amounts to at least 1 atomic % and at most 50 atomic %, and that the distance between the region at which the intensity of light illuminating said photoconductive layer on the light incident side thereof is reduced by absorption therein to 1% of that at incidence and the surface of said photoconductive layer opposite to said light incident side thereof is at most 5 μm.

2. An electrophotographic member according to claim 1, wherein a part which is at least 10 nm thick inwardly of said photoconductive layer from a surface thereof is made of amorphous silicon which has an optical forbidden band gap of at least 1.6 eV and a resistivity of at least $10^{10}\Omega\cdot\text{cm}$.

3. An electrophotographic member according to claim 2, wherein said photoconductive layer of an amorphous silicon containing hydrogen includes a sublayer disposed beyond a surface part of said photoconductive layer, said sublayer having an optical forbidden band gap that is smaller than that of said amorphous silicon forming said surface part, and said sublayer having a thickness of at least 10 nm.

4. An electrophotographic member according to claim 3, wherein an interface region of said photoconductive layer opposite to said surface thereof is made of amorphous silicon which has an optical forbidden band gap of at least 1.6 eV and a resistivity of at least $10^{10}\Omega\cdot\text{cm}$, said optical forbidden band gap of said amorphous silicon of said interface region being larger than that of the amorphous silicon forming the sublayer of said photoconductive layer.

5. An electrophotographic member according to any one of claims 3 and 4, wherein an end face of the sublayer of said photoconductive layer of smaller optical forbidden band gap is at most 5 µm distant from said surface opposite to said light incident side of said photoconductive layer.

6. An electrophotographic member according to any one of claims 1 to 4, wherein said photoconductive layer of amorphous silicon containing hydrogen is formed by reactive sputtering in an atmosphere containing hydrogen.

7. An electrophotographic member according to any one of claims 1 to 4, wherein a part of said amorphous silicon is substituted by at least one element selected from the group consisting of germanium and carbon, wherein the quantity of the substitution by said at least one element is within 30 atomic %.

8. In an electrophotographic system having at least an electrophotographic member which has a support and a photoconductive layer of amorphous silicon containing hydrogen carried by said support, said support being made of a conductive material or an insulating material having a layer of a conductive material thereon, and a light source which illuminates the electrophotographic member; the improvement comprising that said photoconductive layer of an amorphous silicon containing hydrogen has at least 50 atomic % amorphous silicon and said hydrogen amounts to at least 1 atomic % and at most 50 atomic %, and that the distance between a region at which the intensity of light illuminating said photoconductive layer on the light incident side thereof is reduced by absorption therein to 1% of that at incidence and the surface of said photoconductive layer opposite to said light incident side thereof is at most 5 µm.

9. An electrophotographic system according to claim 8, wherein a surface part which is at least 10 nm thick inwardly of said photoconductive layer of an amorphous silicon containing hydrogen from a surface thereof is made of amorphous silicon which has an optical forbidden gap of at least 1.6 eV and a resistivity of at least $10^{10}\Omega\cdot\text{cm}$, and wherein a sublayer of said photoconductive layer is disposed beyond the surface part of said photoconductive layer, said sublayer having an optical forbidden band gap that is smaller than that of said amorphous silicon forming said surface part and having a thickness of at least 10 nm.

10. An electrophotographic system according to any one of claims 8 and 9, wherein a part of said amorphous silicon is substituted by at least one element selected from the group consisting of germanium and carbon, wherein the quantity of the substitution by said at least one element is within 30 atomic %.

11. An electrophotographic member according to any one of claims 1 to 4, further including a blocking layer at the side of said photoconductive layer adjacent said support for suppressing the injection of excess carriers from said support side.

12. An electrophotographic member according to claim 11, wherein said blocking layer at the side of the photoconductive layer adjacent said support is made of a material selected from the group consisting of SiO, $SiO_2$, $CeO_2$, $Ta_2O$, $Al_2O_3$, $V_2O_3$, $Sb_2S_3$, $Sb_2Se_3$, $As_2S_3$, $As_2Se_3$ and polyvinyl carbazole.

13. An electrophotographic member according to claim 11, further including a blocking layer at the surface side of said photoconductive layer for suppressing the injection of charges from the surface side of the photoconductive layer.

14. An electrophotographic member according to claim 13, wherein each of the two blocking layers is made of a material selected from the group consisting of SiO, $SiO_2$, $CeO_2$, $TaO_2$, $Al_2O_3$, $V_2O_3$, $Sb_2S_3$, $Sb_2Se_3$, $As_2S_3$, $As_2Se_2$ and polyvinyl carbazole.

15. An electrophotographic member according to any one of claims 1 to 4, further including a blocking layer at the surface side of said photoconductive layer for suppressing the injection of charges from the surface side of the photoconductive layer.

16. An electrophotographic member according to claim 15, wherein said blocking layer at the surface side of said photoconductive layer is made of a material selected from the group consisting of SiO, $SiO_2$, $CeO_2$, $TaO_2$, $Al_2O_3$, $V_2O_3$, $Sb_2S_3$, $Sb_2Se_3$, $As_2S_3$, $As_2Se_3$, and polyvinyl carbazole.

17. An electrophotographic member according to any one of claims 1 to 4, wherein said distance is at most 2 µm.

18. An electrophotographic system according to any one of claims 8 and 9, wherein said distance is at most 2 µm.

19. An electrophotographic member according to any one of claims 1 to 4, wherein the thickness of said photoconductive layer of an amorphous silicon containing hydrogen is at most 100 µm.

20. An electrophotographic member according to any one of claims 1 to 4, wherein said photoconductive layer of amorphous silicon containing hydrogen is doped with a material selected from the group consisting of carbon, boron and germanium.

21. An electrophotographic member according to claim 1, wherein said hydrogen amounts to at most 40 atomic %.

22. An electrophotographic member according to claim 1, wherein said hydrogen amounts to at most 30 atomic %.

23. An electrophotographic member according to claim 1, wherein said support is made of metal.

24. An electrophotographic member according to claim 1, wherein said support is made of an electrically insulating material with an electrode thereon.

* * * * *